US009772356B2

(12) United States Patent
Parkman

(10) Patent No.: US 9,772,356 B2
(45) Date of Patent: Sep. 26, 2017

(54) CIRCUITRY AND SHUNT ARRANGEMENTS FOR TEMPERATURE-COMPENSATED MEASUREMENTS OF CURRENT

(71) Applicant: Astronics Advanced Electronic Systems Corp., Kirkland, WA (US)

(72) Inventor: Igor B. Parkman, Redmond, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 125 days.

(21) Appl. No.: 14/842,289

(22) Filed: Sep. 1, 2015

(65) Prior Publication Data

US 2017/0059632 A1 Mar. 2, 2017

(51) Int. Cl.
*G01R 31/14* (2006.01)
*G01R 19/32* (2006.01)
*G01R 15/14* (2006.01)

(52) U.S. Cl.
CPC .......... *G01R 19/32* (2013.01); *G01R 15/146* (2013.01)

(58) Field of Classification Search
CPC .. G01N 25/00; G01N 27/046; G01N 30/8624; G01R 15/14; G01R 19/0092; G01R 27/02; G01R 19/03; G01R 19/225; G01R 19/32; G01V 3/102; G01L 1/225; G01L 3/1471; G06F 17/15; G06F 17/18; H02M 2001/00; H02M 2001/0009; H02M 3/156
See application file for complete search history.

(56) References Cited

U.S. PATENT DOCUMENTS

| 3,295,052 | A | * | 12/1966 | Martin | G05F 1/563 323/224 |
| 4,584,525 | A | * | 4/1986 | Harnden, Jr. | G01R 1/203 324/105 |
| 5,313,165 | A | | 5/1994 | Brokaw | |
| 6,028,426 | A | | 2/2000 | Cameron et al. | |
| 2011/0089931 | A1 | * | 4/2011 | Podlisk | G01R 1/203 324/126 |

FOREIGN PATENT DOCUMENTS

EP 0 573 408 B1 3/1997
JP 06275227 A * 9/1994

* cited by examiner

*Primary Examiner* — Vinh Nguyen
(74) *Attorney, Agent, or Firm* — Wiggin and Dana LLP; Gregory S. Rosenblatt; Abraham Kasdan

(57) ABSTRACT

Shunt arrangements and current measuring circuits are provided for temperature compensated current measurements as well as current measurements that are compensated for changes in the characteristics of the shunt material as a result of manufacturing tolerances. The current measuring circuits may include a temperature sensing element in a negative feedback path of an operational amplifier for providing temperature compensation. The shunt arrangements may include a calibration shunt formed in the same material as a main shunt and circuitry for measuring the temperature drift error of the calibration shunt and applying that error to compensate for temperature drift of the main shunt.

19 Claims, 7 Drawing Sheets

CIRCUITRY AND SHUNT ARRANGEMENTS FOR TEMPERATURE-COMPENSATED MEASUREMENTS OF CURRENT

FIELD OF THE DISCLOSURE

The subject matter of the present disclosure generally relates to the field of current measurements using a current shunt, and more particularly to shunt arrangements and circuitry for compensating such current measurements to take into account changes in the shunt resistance that occur with changes in temperature as well as changes in the shunt characteristics due to manufacturing tolerances, so that such changes do not appreciably affect the accuracy of the current measurement.

BACKGROUND OF THE DISCLOSURE

The use of shunts to measure an electric current flowing in a circuit has a long history. Typically, such current measurements rely on measuring the voltage drop developed across a conductive material when current is sent through the material. For example, if one employs a conductive material having a known resistance R, then a current I flowing through the material may be ascertained by simply measuring the voltage drop V generated across the material by the current flow, and applying Ohm's law: I=V/R.

By knowing the resistance of a fixed volume of conductive material under standard temperature and pressure (STP) conditions, as well as the variation of that resistance with temperature, the conductive material may be used to directly determine the magnitude of the current flowing through the current carrying path.

The conductive material may be used to carry current from a fixed or variable alternating current (AC) or direct current (DC) source to a fixed or variable load. Typical conductive materials, as a consequence of their inherent physical properties, have an electrical resistance characteristic that varies with the material's cross section, length, and temperature. Changes in temperature can therefore impact the accuracy of a current measurement, and need to be compensated for.

In order to measure large currents with reasonably low voltages, shunts are generally constructed to have low resistance. However, depending on the application and current range of interest, this often results in a physically large and therefore undesirable shunt.

To avoid variations in resistance that occur with changes in temperature from introducing error into the current measurement, relatively expensive shunts have been developed, employing alloys that exhibit exceedingly small variations of resistivity with temperature. The most common of these alloys is Manganin, which is comprised of copper, manganese, and nickel. Other alloys, such as Constantan (copper, manganese, nickel), or iron-chrome, or manganese-copper, as well as other proprietary alloys may also be used.

Various electronic means have been devised in the art to compensate for temperature variations in shunt resistance. For example, U.S. Pat. No. 6,028,426 discloses a fixed gain amplifier circuit whose output is attenuated to compensate for temperature effects by using a thermistor whose resistance varies inversely with temperature.

U.S. Pat. No. 5,095,274 discloses a shunt formed from a portion of a circuit board trace and a circuit for compensating temperature changes in shunt resistance by using a diffused resistor with particular characteristics in a comparator circuit.

U.S. Patent Publication 2011/0089931 shows temperature compensation circuitry for current shunts that use thermistors to vary the gain of an amplifier by varying its input resistance, such that the amplifier compensates for temperature variations in the shunt.

However, the prior art does not provide the benefits of the novel shunt and circuit arrangements disclosed herein, as further described below.

BRIEF SUMMARY OF THE DISCLOSURE

The circuits, shunt arrangements and methods disclosed herein reduce the need to use temperature stable alloys as the shunt material and/or heavy, large and expensive external shunts. The disclosed embodiments therefore result in cost, weight, and size reductions as compared to other current measuring techniques, as well as manufacturability improvements and increased reliability resulting from reduced heat dissipation.

For example, by utilizing a section of an existing current carrying element as the current sensing volume, no additional high current shunts may be required, thereby reducing costs. Further, since the current sensing volume of such existing current carrying element is in direct thermal contact with the current carrying structure, the current carrying element may be constructed so that power dissipation and therefore heat dissipation is very low.

Additionally, since the current sensing volume is part of a larger current carrying element, the size and weight of the current sensing volume may be significantly reduced as compared to conventional external current shunts.

Finally, since temperature variations in the current carrying element may be compensated for in accordance with the embodiments disclosed herein, use may be made of relatively inexpensive elemental metals such as copper and aluminum, or non-complex alloys, such as brass, for the current sensing volume, thereby eliminating the need to use expensive temperature-stable alloys, such as manganin, as the shunt material.

The benefits of the embodiments disclosed here may be applied to AC and DC current measurements, and are particularly useful in high current (over 50 A) applications in which the $I^2R$ loses necessitate precision low ohmic shunts, which have large form factors and weights that make them undesirable for many applications.

In a first exemplary embodiment described below, a high gain amplifier is directly coupled to measure the voltage across a shunt and a second compensation amplifier uses a temperature sensing element in its feedback loop to compensate for variations in resistance of the shunt with temperature. This embodiment results in at least two benefits. First, offset currents at the amplifier inputs are less of an impact on input sense error. Second, by using separate amplifiers, the initial gain stage is decoupled from the temperature compensation operation. This allows the temperature scaling correction to be a simple multiplier.

Further, by using a temperature sensing element in the feedback loop of the second amplifier, the output of both amplifiers may be arranged to have low impedance relative to each other and to any downstream circuitry, thereby lowering susceptibility to noise and offset currents from such downstream components.

Additionally, using negative feedback gain adjust effectively increases the compensation slope created by the temperature sensing element. When using a temperature sensing element without active gain, the rate of change of resistance with temperature is limited to that of the element itself. Applying a gain allows scaling such that the effect of dR/dT becomes greater.

In a second exemplary embodiment described below, the use of a calibration shunt (e.g., formed from copper) in series with a stable calibration resistance (e.g., a manganin resistor) permits temperature-induced errors as well as manufacturing related errors to be nulled out by comparing the drop across the calibration shunt volume to that across the stable calibration resistance. This arrangement also permits the same temperature-induced error in a main shunt to be nulled out.

Further and advantageously, in this second exemplary embodiment there is no need for a separate temperature sensing element. Still further, by forming a calibration path whose resistance is several orders of magnitude larger than the main shunt current path, current through the calibration path may be minimized, thus minimizing the power dissipated in the calibration shunt resistor.

BRIEF DESCRIPTION OF THE DRAWINGS

The foregoing advantages of the exemplary embodiments disclosed herein, and other aspects and benefits of the present disclosure will be further understood by reference to the following detailed description of several exemplary embodiments, when read in conjunction with the accompanying drawings, in which.

DETAILED DESCRIPTION

Figure 1:
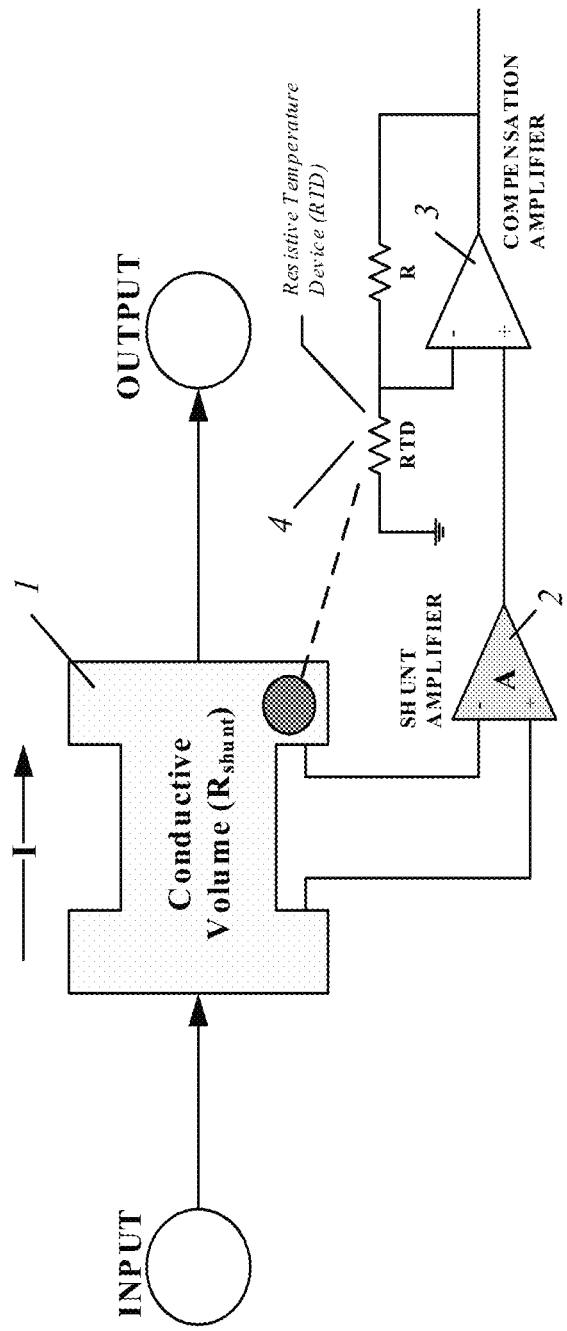
FIG. 1 is a schematic diagram of a first exemplary embodiment.

A first exemplary embodiment disclosed herein provides direct temperature compensation of a shunt by using a temperature sensing element, such as a linear resistance temperature device ("RTD"), that is thermally coupled to the shunt material. As those skilled in the art will recognize, RTDs are generally manufactured from metals whose resistance over a specified temperature range increases linearly with temperature. As shown in FIG. 1, in this embodiment a metallic shunt element having a fixed resistance at a fixed temperature forms a conductive volume. An instrumentation voltage amplifier 2 is connected to the positive and negative ends of the shunt (where the positive end of the shunt is defined by positive voltage drop across the shunt with respect to forward current). The RTD is mounted to the shunt so that it is in thermal contact with the shunt and tracks changes in the temperature of the shunt. The RTD is also positioned in the feedback loop of a non-inverting operational amplifier to provide for temperature compensation by automatically adjusting the gain of that amplifier.

In particular, with reference to FIG. 1, conductive volume 1 acts as a shunt resistance $R_{shunt}$, through which current I flows from an input source to an output load. For the typical materials that may form conductive volume 1, it can be assumed that the $R_{shunt}$ will exhibit an increase in resistivity with increasing temperature and that this temperature drift of the resistivity (e.g., as measured by % change in resistance per degree C.) will be reasonably linear.

As evident, in the arrangement shown in FIG. 1, the voltage read across the conductive volume 1, via Ohm's law, is equal to the current through the conductive volume 1 multiplied by the resistance of the shunt $R_{shunt}$. However, as noted above, due to changes in resistance of the conductive volume with temperature, there is an unwanted temperature "drift" term that has to be corrected for when determining the current through the shunt.

As a result of this temperature drift term, the voltage across the shunt may be written as the sum of two terms, namely a desired term $IR_{shunt}$ (where $R_{shunt}$ is the shunt resistance at 20° C.) and an undesired term due to the change in resistance of the shunt with temperature.

This undesired temperature drift term may be written as:

$$\left[1 - \alpha\frac{\%}{c}(20° \text{ C.} - T_{amb})\right]$$

such that voltage across the shunt at a temperature $T_{amb}$ is then:

$$IR_{shunt}\left[1 - \alpha\frac{\%}{c}(20° \text{ C.} - T_{amb})\right],$$

The bracketed quantity may be viewed as the unwanted temperature drift term "D(T)". In this equation, α denotes a coefficient denoting the change in resistivity of the conductive shunt material in % per degree Celcius, C denotes the temperature in degrees Celcius, and $T_{amb}$ denotes the temperature of the conductive volume.

As shown in FIG. 1, the differential voltage across the shunt 1 is sent to an instrumentation amplifier 2 having a gain "A". The output of differential amplifier 2 is:

$$AIR_{shunt}\left[1 - \alpha\frac{\%}{c}(20° \text{ C.} - T_{amb})\right] = AIR_{shunt} * D(T),$$

where A is a gain term associated with amplifier 2. The output of amplifier 2 thus scales the product of the shunt voltage $IR_{shunt}$ and the temperature drift term D(T) by gain A.

As further shown in FIG. 1, a temperature sensing element, such as a resistance temperature device 4 ("RTD") that exhibits substantially linear resistance change with temperature, is mounted in thermal contact to the conductive shunt volume 1, such that the temperature of the RTD 4 is the same as and tracks variations in the shunt temperature.

The RTD 4 is electrically placed in the negative feedback loop of a non-inverting compensation amplifier 3. As a result of the placement of the RTD 4 in this negative feedback loop, as the temperature of the shunt goes up ($R_{shunt}$ increases) the gain of compensation amplifier 3 will go down, and as the temperature of the shunt goes down ($R_{shunt}$ decreases) the gain of compensation amplifier 3 will go up. Effectively, the variation in the RTD resistance scales the drift error D(T) by a term proportional to its inverse, i.e., by B/D(T).

The output of amplifier 3 therefore provides a temperature compensated value for the desired voltage across the shunt $IR_{shunt}$, namely:

$$AIR_{shunt}*D(T)*B/D(T) \text{ or } AB*IR_{shunt},$$

where AB is a multiplicative gain term arising from the characteristics of amplifiers 2 and 3.

While the foregoing exemplary embodiment provides for accurate temperature compensation without the need for calibration of the compensation amplifier 3, this approach is still dependent on the manufacturing consistency of the conductive volume 1 used for the shunt. For example, if the conductive volume varies by 10% from unit to unit due to manufacturing tolerances, there will be a 10% variation in the nominal resistance of the shunt, and therefore a possible 10% variation in a current measurement.

In this regard, in preferred embodiments and designs, the copper foil of a printed circuit board may be conveniently used to form a conductive shunt volume. The thickness of the copper foil is typically designated by specifying the weight of the foil in ounces per square foot. The allowable tolerance set by the IPC standard (promulgated by the Association Connecting Electronics Industries) for copper foil is +/−10% of the nominal weight (and therefore thickness). However, based on data provided by TTM Technologies, an industry supplier of printed circuit boards and related products, copper foil manufacturers tend to control their copper foil thickness closer to +/−3%, and generally try to maintain their tolerances at the bottom end of the IPC standard.

Figure 2:
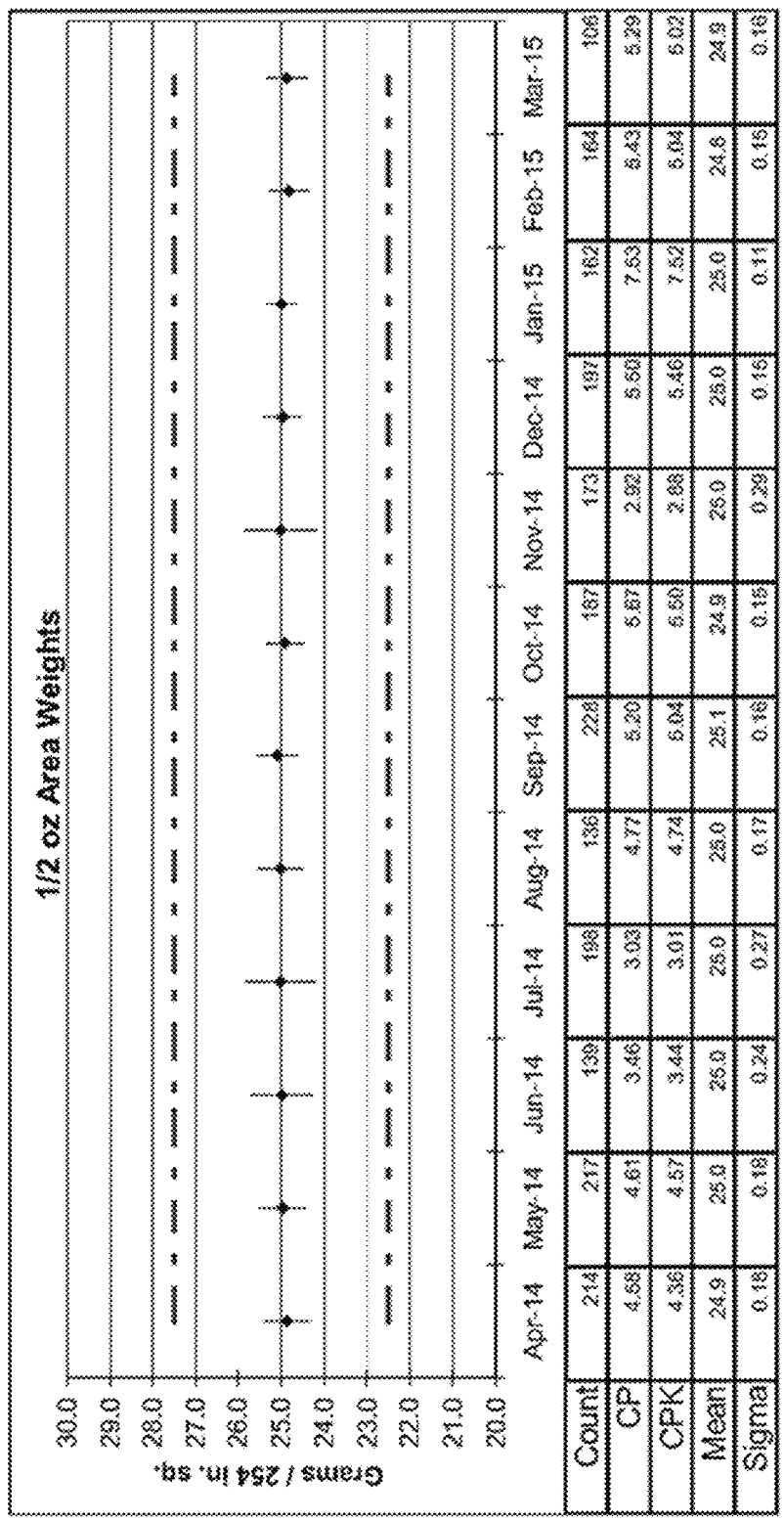
FIG. 2 shows the variation in thickness of copper foil materials used for printed circuit board construction having a nominal thickness of 0.5 oz./sq. ft.
Figure 3:
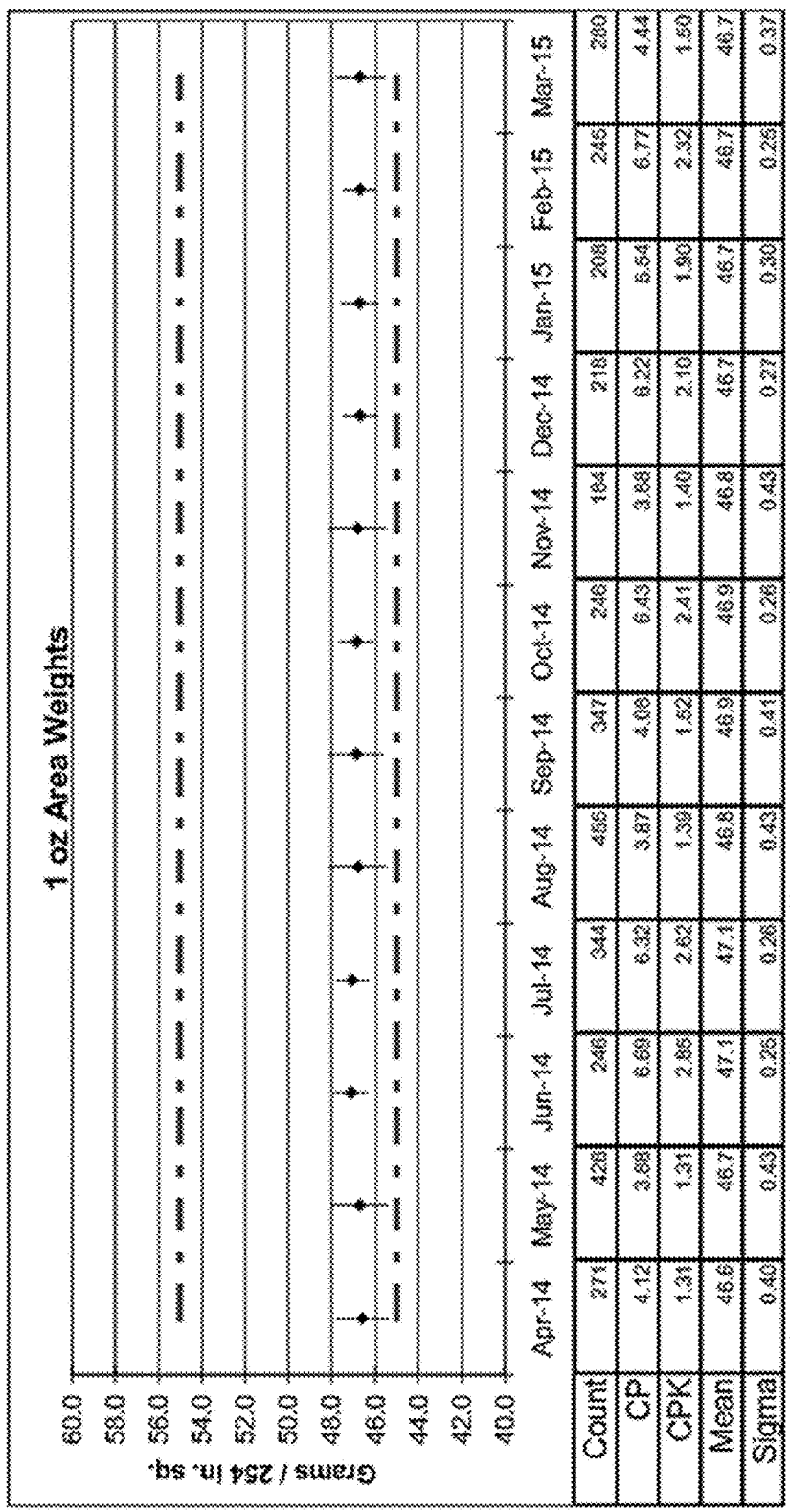
FIG. 3 shows the variation in thickness of copper foil materials used for printed circuit board construction having a nominal thickness of 1 oz./sq. ft.
Figure 4:
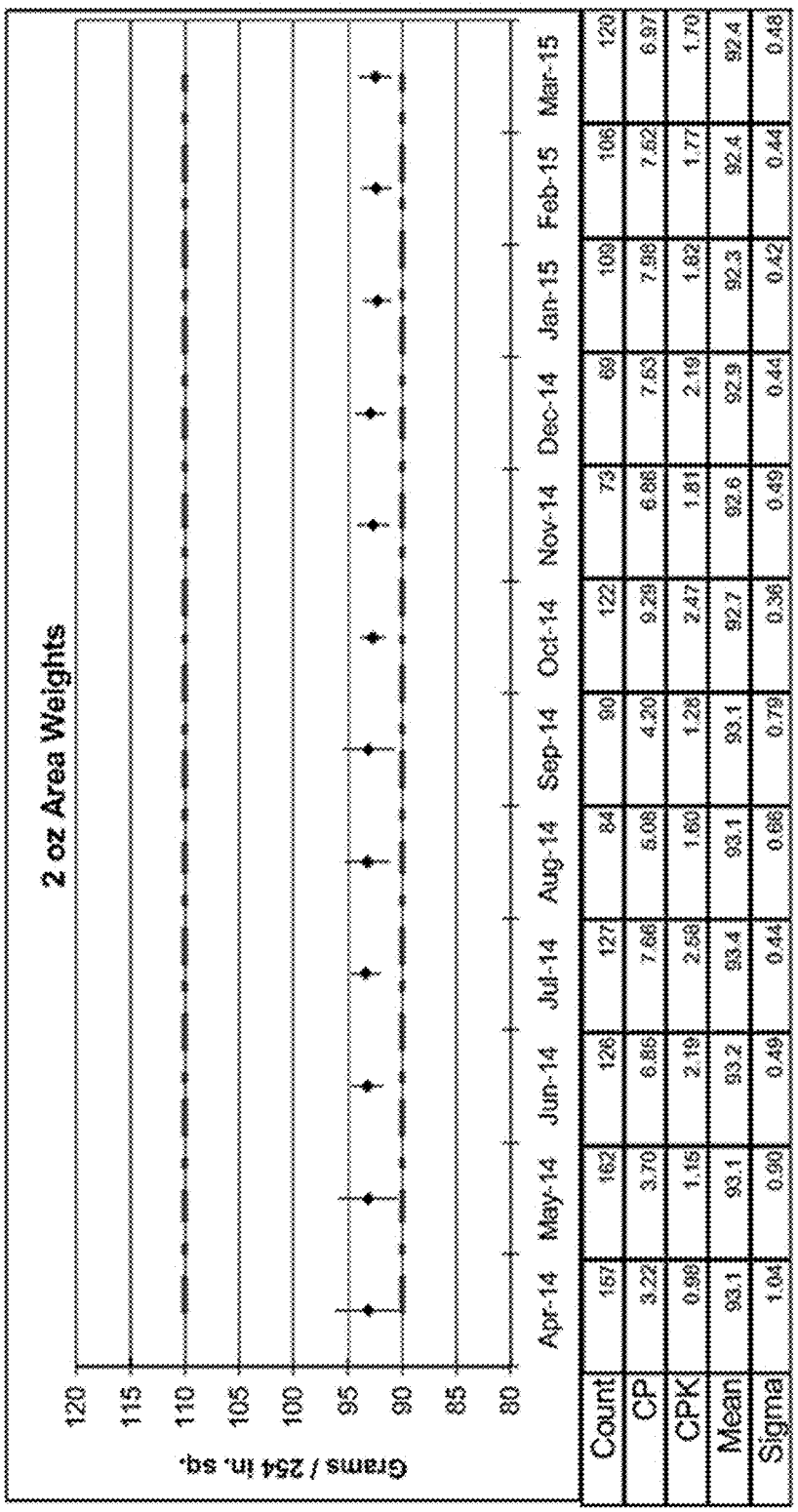
FIG. 4 shows the variation in thickness of copper foil materials used for printed circuit board construction having a nominal thickness of 2 oz./sq. ft.

For example, a year's worth of foil data was provided by TTM Technologies for copper foil having three different nominal thicknesses sourced from a particular supplier, OAK-MITSUI. This data is reproduced in FIGS. 2-4 for respective foil thicknesses of 0.5 oz./sq. ft., 1.0 oz./sq. ft. and 2 oz./sq. ft and shows that the variation in thickness of these copper foils typically does not exceed +/−3.5% due to manufacturing tolerances, making such copper foils in printed circuit boards suitable for use as viable shunt material for many applications.

It should be noted however, that if such copper foil is used as the shunt material, it is important that only internal foil layers be used, since it is not possible to control the copper plating on the top and bottom layers of a circuit board with the same accuracy as the internal layers.

Figure 5:
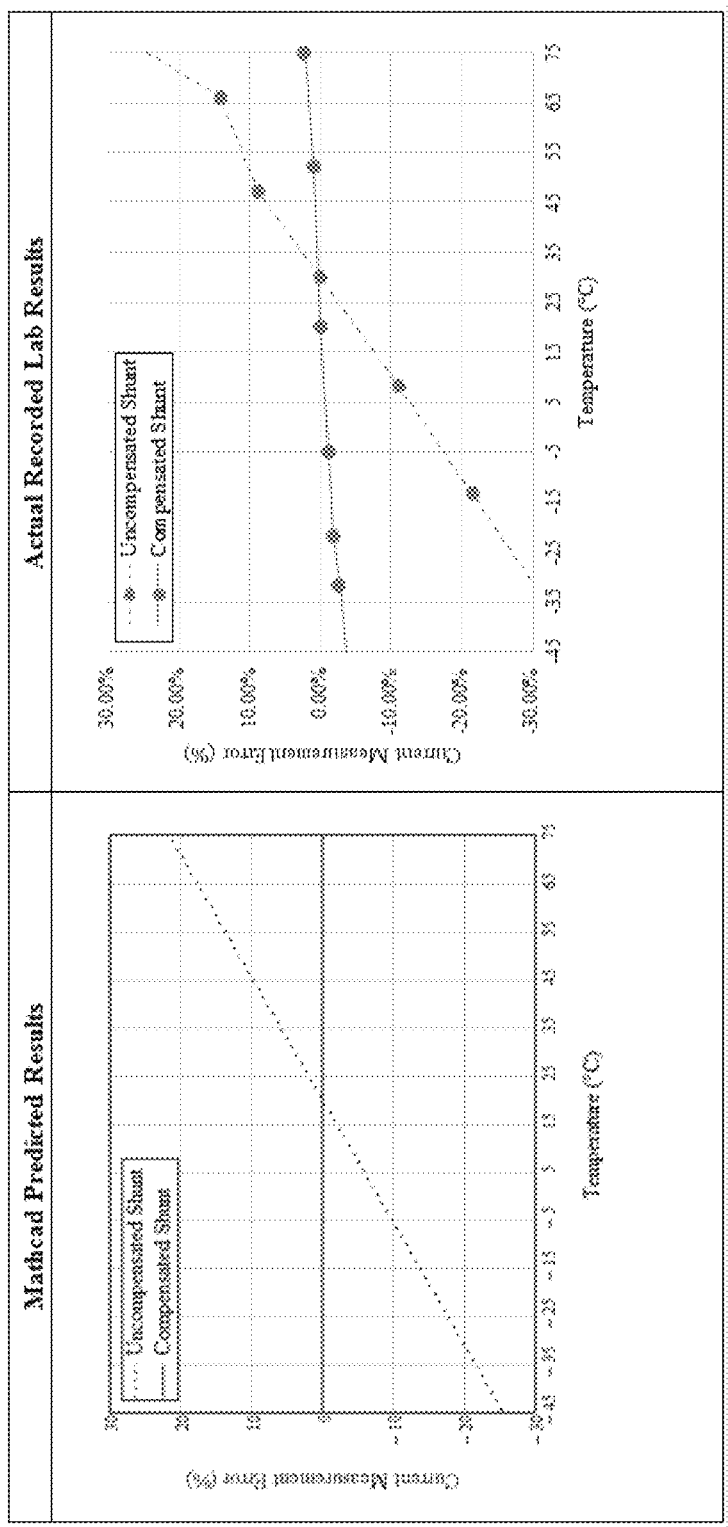
FIG. 5 shows measurements taken for the output error of a compensation circuit constructed in accordance with the FIG. 1 embodiment, as compared to predicted results using a Mathcad simulation.

The temperature compensation approach described above with respect to the FIG. 1 embodiment was tested using a copper foil shunt. In particular, testing was performed on a 10µΩ shunt constructed from 1 oz copper on 4 parallel layers, with a 50 A test current. The test results over a wide range of temperatures are shown in the chart on the right-hand side of FIG. 5, confirming that very good temperature compensation is achievable by using the above-disclosed embodiment. These experimental results were comparable to the values shown in the left-hand chart of FIG. 5, which were predicted using Mathcad analysis.

The second exemplary embodiment disclosed herein relies on indirect temperature compensation of a main shunt using a separate calibration shunt that has the same temperature drift error. Advantageously, since the main shunt and calibration shunt are formed from the same material, this embodiment can reduce or effectively eliminate the errors resulting from manufacturing-related tolerance changes in the material.

This particular exemplary embodiment is particularly well suited for use with copper foil shunts that are constructed directly using the current carrying path of a printed circuit board. Like the first embodiment described with respect to FIG. 1, this second embodiment may also be used for measurement of either AC or DC currents, but care should be taken when measuring AC currents so that additional error is not introduced by the presence of phase shifts.

Conceptually, in this second embodiment, a small stable shunt and a calibration shunt, each having substantially higher resistance than the main shunt used for current measurement, are formed in series with each other. The resistance of the calibration shunt, being made from the same material as the main shunt and at the same temperature as the main shunt, varies with temperature in the same way as the main shunt.

The small stable shunt is formed from a material (e.g., manganin) whose resistance does not change appreciably with temperature (hence the reference to it being a "stable" shunt). The stable shunt may be purchased from any number of vendors. In addition to manganin, other materials such as copper-manganese alloy, or iron-chrome alloy may also be used for the stable shunt.

In operation, the deviation in voltage between the calibration shunt and stable shunt is measured to determine the temperature drift error. Once this drift error is determined, it is applied via feedback to compensate for the temperature drift in the main shunt. Since the main shunt and the calibration shunt are formed at thermally similar locations, and of the same material, their temperature drift errors will be the same. Further, and significantly, since the main shunt and calibration shunt are made from the same material lot (e.g., the copper foil of a printed circuit board), variations in manufacture of the foil, (e.g. thickness variations) will also be effectively cancelled out by this exemplary embodiment.

Figure 6:
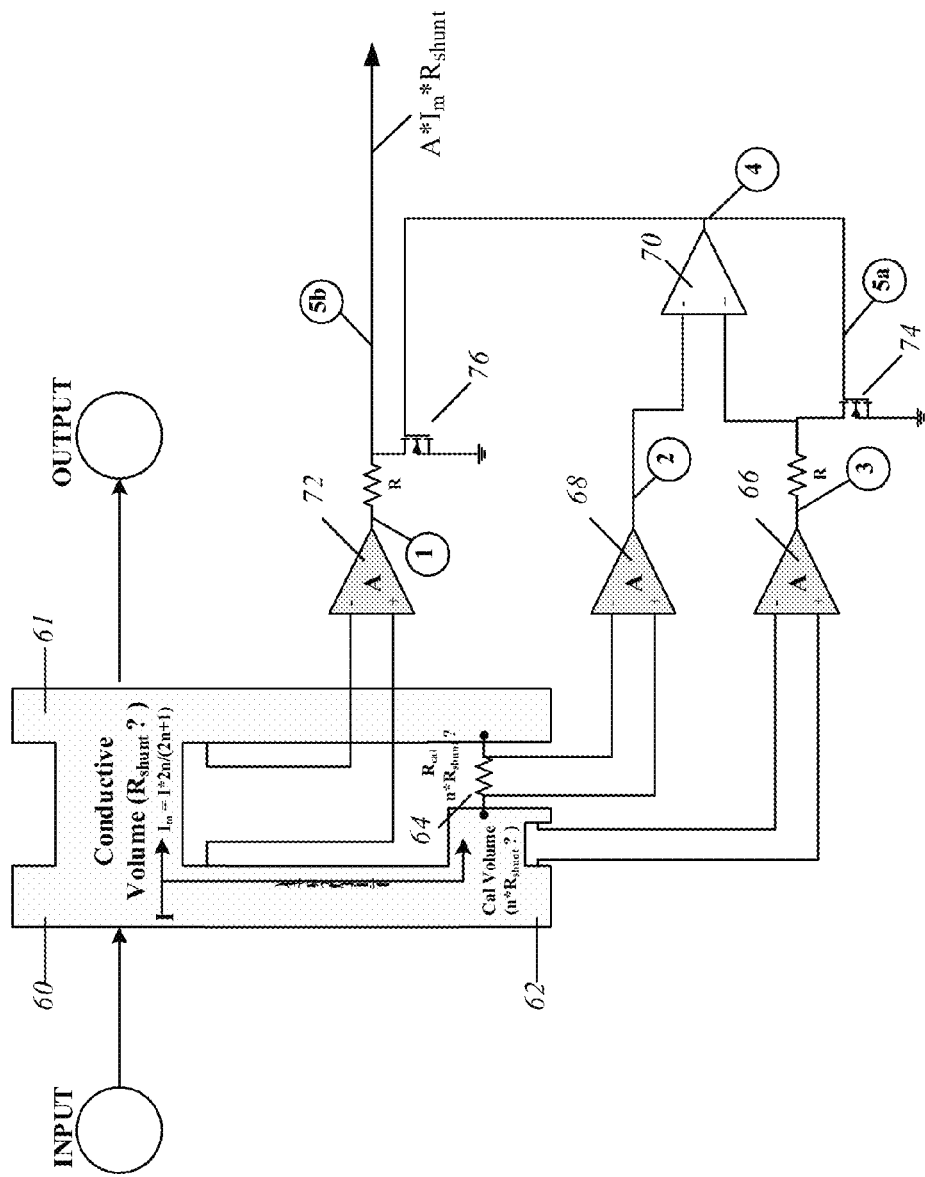
FIG. 6 is a schematic diagram of a second exemplary embodiment.

With reference to FIG. 6, the general approach is to construct a main shunt in a first conductive volume of a material 61. A current to be measured flows through the main shunt. The nominal main shunt resistance is set to correspond to the minimum operating temperature expected for the main shunt. The minimum operating temperature, as specified by the operating requirements of the design, is chosen for the main shunt resistance calculation so that only an increase in resistance results during operation, but never a decrease.

As shown in FIG. 6, a main shunt (through which flows a current $I_m$ that is to be measured) is formed in a first conductive volume (generally indicated by reference numeral 60) of material 61. A second conductive volume 62 at the same temperature as the first conductive volume 60 is also formed in the same material 61. As shown in FIG. 6, a calibration shunt, through which a calibration current flows, is formed in the second conductive volume 62. A stable shunt 64 is provided in series with the calibration shunt. The calibration shunt is constructed to have n-times greater resistance than the main shunt. Likewise, the stable shunt 64, which may be formed from Manganin or other temperature stable alloy, is constructed or procured to have n-times greater resistance than the main shunt. The greater resistances of the calibration shunt and stable shunt 64 permits their sizes to be minimized, and results in each of these series-connected shunts receiving only a fraction $I_m/2n$ of the current $I_m$ that flows through the main shunt, via current division. For example, in a typical application involving a 50

A nominal main shunt current, n could be in the range of about 50 to 100. Thus, for a main shunt of 10 µΩ, the calibration and stable shunts may each be relatively small sized shunts in the range of about 0.5 mΩ to 1 mΩ. Therefore, at a current of 50 A, the calibration path current would be relatively small in the range of 0.495 A (0.5 mΩ shunts) to 0.249 A (1 mΩ shunts).

The foregoing arrangement effectively divides the total current I flowing from an input into the material into two paths: a first path through the first conductive volume in which a current $$I_m = I \frac{2n}{2n+1}$$

flows through the main shunt resistance; and a second path in which a smaller current $I_t = I_m/2n = I/(2n+1)$ flows through the second conductive volume that includes the higher resistance calibration and stable shunts that are in series with each other.

In the exemplary embodiment shown in FIG. 6, the main shunt is formed in the upper portion of the conductive volume 61 generally indicated by reference numeral 60. One of the two series shunts is constructed from the same material as the main shunt, using the same design techniques, and by virtue of being located on the same assembly, is expected to have the same manufacturing-related tolerances as the main shunt. This calibration shunt is shown in FIG. 6 as formed in the lower portion of the conductive volume 61, in a calibration volume generally indicated by reference numeral 62. The second series shunt is chosen to be a conventional factory-calibrated stable current shunt, having a resistance that is n times that of the main shunt. In FIG. 6, this stable shunt is labelled as shunt 64. Through use of either Manganin, or similar temperature stable alloys that exhibit very little change in resistivity with temperature, the temperature variation of the resistance of this stable shunt 64 effectively is assumed to be zero. Although its resistance does not change appreciably with temperature, the stable shunt is mounted so that it is generally at the same temperature as the calibration and main shunts.

As further shown in FIG. 6, the voltages developed across the unstable calibration shunt 62, and the stable calibration shunt 64 are each connected to instrumentation amplifiers, and the outputs of these instrumentation amplifiers are sent to an operational amplifier. The difference between the unstable shunt voltage and the stable shunt voltage is a measure of the drift error due to temperature variation, as well as nominal resistance error due to manufacturing related material thickness error. The operational amplifier compensates for that drift error and applies that compensation to a main shunt amplifier.

Specifically, in the exemplary embodiment of FIG. 6, voltage developed across the unstable calibration shunt 62 is applied to instrumentation amplifier 66, while the voltage across the stable shunt 64 is applied to instrumentation amplifier 68. The difference between the outputs of these two amplifiers, which is a measure of the temperature drift error and manufacturing related error, is fed into operational amplifier 70.

As further shown in FIG. 6, the output of amplifier 70 is fed back through an active voltage divider 74 connected to the output of amplifier 66. The active voltage divider 74 may be implemented, as shown, by using N-CHANNEL MOSFET devices that have their gates and sources connected together, although other active voltage dividers known to workers of skill in the art may also be utilized, such as bipolar transistors, or electronically controlled potentiometers.

With further reference to FIG. 6, main shunt amplifier 72 receives at its inputs the voltage developed across the main shunt, which includes a temperature drift term. As shown in the FIG. 6 embodiment, main shunt amplifier 72 is connected at its output to compensation amplifier 70 through a comparable MOSFET active voltage divider 76.

During operation, operational amplifier 70 will adjust its output to bring the temperature drift error at its inputs (representing the voltage difference between the calibration shunt and the stable shunt 64) back to zero. Since this error may be assumed to be the same for the main conductive volume as the calibration conductive volume, operational amplifier 70 will likewise compensate for the temperature drift error at the output of the main shunt amplifier 72.

By way of further explanation, and again referring to FIG. 6, the uncompensated output of the main shunt amplifier 72 at point 1 may be written as:

$$I_m R_{shunt}\left[1 - \alpha \frac{\%}{c}(T_{min} - T_{amb})\right],$$

where the quantity in square brackets is a temperature drift error term that may be designated as D(T).

The output of the stable shunt amplifier 68 at point 2, is $A\, I_t\, n\, R_{shunt}$. This is because the stable shunt has $I_t$ current flowing through it, is assumed to exhibit no drift in resistance with temperature, and is sized to have n-times larger resistance than $R_{shunt}$.

On the other hand, the output of the unstable shunt amplifier 66 at point 3 is:

$$I_t n R_{shunt}\left[1 - \alpha \frac{\%}{c}(T_{min} - T_{amb})\right] = I_t n R_{shunt} D(T)$$

Since compensation amplifier 70 is a closed loop operational amplifier, it will adjust to make the difference between its inputs zero. This means that:

$$A\, I_t n R_{shunt}\, D(T)*(R_{comp}/(R_{comp}+R))-A\, I_t\, n\, R_{shunt}=0$$

For the above expression to be zero, the active voltage dividers will adjust so that $D(T)*(R_{comp}/(R_{comp}+R))=1$, to effectively cancel out the drift term D(T).

Figure 7:
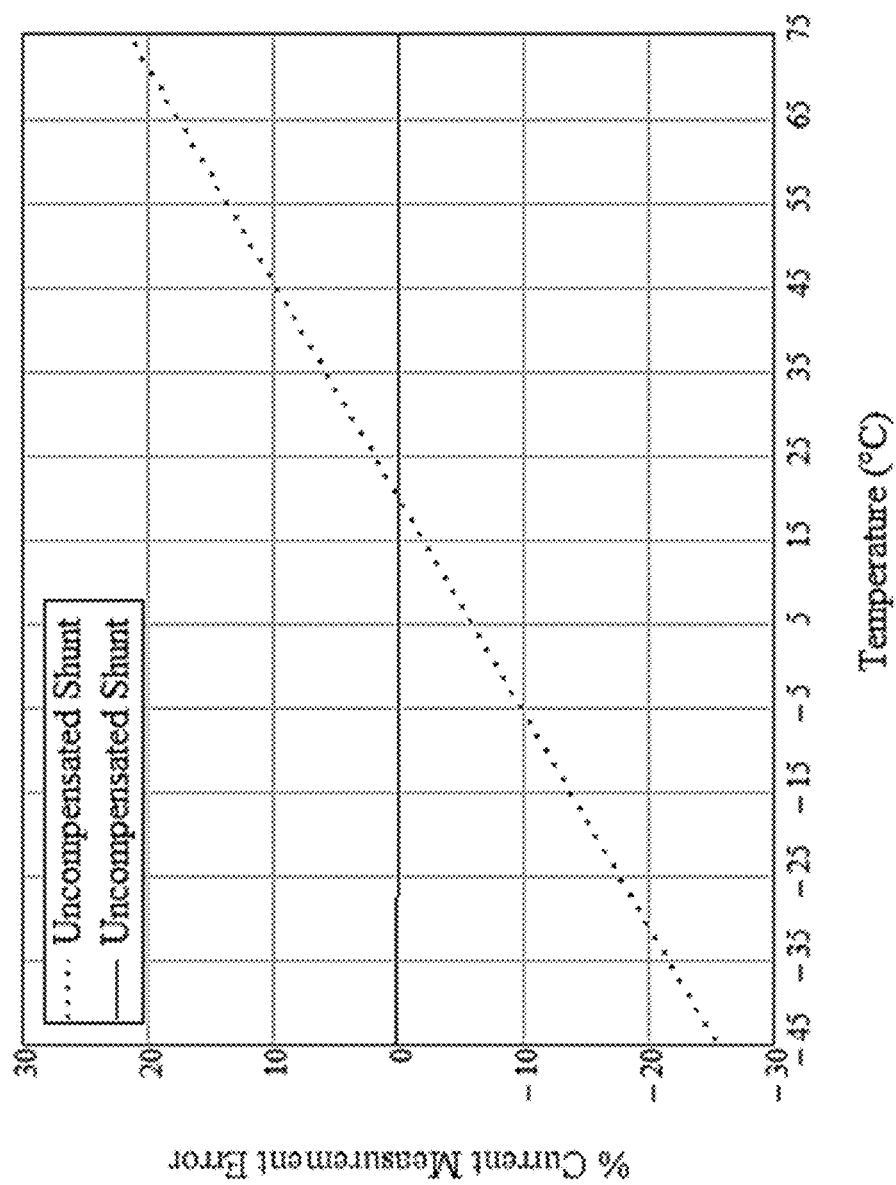
FIG. 7 shows predicted results of the compensation circuit design in accordance with the FIG. 6 embodiment.

It may be reasonably assumed that the same manufacturing differences apply to all points of the conductive volume 61. Further, by using properly matched active pull-down devices (shown as MOSFETs in FIG. 6), it can also be assumed that the drift error at point 5a will be the same as the drift error at point 1 of the main shunt. The error compensating signal at point 5a may therefore be applied to cancel out the drift error at point 1, to obtain a temperature compensated value $AI_m R_{shunt}$ at the output of amplifier 72. Effectively, the drift error D(T) term is effectively cancelled by the term $R_{comp}/(R_{comp}+R)$ arising from the active voltage divider. The Mathcad simulation results, over a wide temperature range, are shown in FIG. 7, confirming that very good temperature compensation is achievable by using the above-disclosed embodiment.

The temperature compensation approaches disclosed herein may be used to obtain accurate current measurements in various applications, including aerospace and/or automotive and/or industrial and/or medical and/or consumer applications requiring temperature stable measurements of AC and/or DC electrical currents. For example, the temperature compensated current sensing structures and circuit arrangements disclosed herein may be used in various applications, including but not limited to current measuring designs that operate as:

A single sub-assembly within an end-item unit.

An element of a circuit card assembly (CCA) in which the CCA contains peripheral functionality which may or may not be related to the current sensing architecture.

An element of an integrated circuit or module, which includes current sensing as one of its functions.

As noted above, the conductive volume to be used as a current carrying shunt resistance is an essential part of the overall design. The material used for the current carrying volume itself is not important, as long as the resistivity and temperature of the material are characterized.

While the disclosed embodiments have many different uses that will be apparent to a worker of ordinary skill upon reading this disclosure, these embodiments are particularly beneficial in applications involving measurements of large currents (greater than 50 A), for example, in contactor (power relay) or power distribution type units which would ordinarily use externally mounted large form-factor shunts.

Although the disclosed subject matter has been described and illustrated with respect to the exemplary embodiments disclosed herein, it should be understood by those of ordinary skill in the art that features of the disclosed embodiments can be combined, modified, rearranged, etc., to produce additional embodiments within the scope of the invention, and that various other changes, omissions, and additions may be made therein and thereto, without departing from the spirit and scope of the present invention, as set forth in the following claims.

What is claimed is:

1. A circuit for providing a temperature-compensated measure of a current flowing through a shunt, comprising:
   a temperature sensing element mounted on said shunt that measures the temperature of said shunt,
   a first amplifier connected across said shunt for measuring a voltage caused by said current, said voltage including a temperature drift error due to changes in temperature of said shunt,
   and
   a second amplifier connected to the output of the first amplifier and including said temperature sensing element in a negative feedback path, wherein the output of the second amplifier is compensated for said temperature drift error.

2. The circuit of claim 1, wherein the temperature sensing element is a resistive temperature device.

3. The circuit of claim 1, wherein the temperature sensing element is mounted in thermal contact to said shunt so that its temperature tracks the temperature of said shunt.

4. The circuit of claim 1 wherein the first amplifier is an instrumentation amplifier.

5. The circuit of claim 1 wherein the second amplifier is an operational amplifier.

6. The circuit of claim 5 wherein the second amplifier is a non-inverting amplifier.

7. A shunt arrangement comprising,
   a main shunt formed in a first conductive volume of a material through which a current to be measured flows;
   a calibration shunt having higher resistance than said main shunt formed in a second conductive volume of said material through which a calibration current flows, and
   a stable shunt having higher resistance than said main shunt connected in series with said calibration shunt.

8. The shunt arrangement of claim 7, wherein the first conductive volume is at the same temperature as the second conductive volume.

9. The shunt arrangement of claim 7, wherein the first conductive volume has the same manufacturing tolerances as the second conductive volume.

10. The shunt arrangement of claim 7 wherein the resistance of the stable shunt and calibration shunt are each substantially the same.

11. The shunt arrangement of claim 7 wherein the stable shunt is formed from manganin or similar temperature stable alloy.

12. A method of using the shunt arrangement of claim 7, comprising the steps of:
    measuring the difference between a voltage across said calibration shunt and a voltage across said stable shunt when a current is passed therethrough, said difference corresponding to a temperature drift error in the calibration shunt, and
    using said difference to compensate for the temperature drift error of said main shunt.

13. A circuit for providing a temperature-compensated measure of the flowing through the main shunt of the shunt arrangement of claim 7, comprising:
    a first amplifier connected across said main shunt for measuring a voltage generated by current flow through said main shunt,
    a second amplifier connected across said calibration shunt for measuring a voltage generated by current flow through said calibration shunt,
    a third amplifier connected across said stable shunt for measuring a voltage generated by current flow through said stable shunt, and
    a differential amplifier having inputs connected to the outputs of the second and third amplifiers, and an output connected to respective active voltage dividers at the outputs of the first and second amplifiers, such that a temperature drift error is determined by the differential amplifier and compensates the output of the first amplifier for temperature drift of the main shunt.

14. A measuring system for providing a temperature-compensated measure of current flowing through a main shunt, comprising:
    a main shunt formed in a first conductive volume of a material;
    a first amplifier connected across said main shunt for measuring a voltage due to current flow through said main shunt,
    a calibration shunt formed in a second conductive volume of said material;
    a second amplifier connected across said calibration shunt for measuring a voltage due to current flow through said calibration shunt,
    a stable shunt connected in series with said calibration shunt, said stable shunt having substantially no temperature drift error,
    a third amplifier connected across said stable shunt for measuring a voltage due to current flow through said stable shunt, and
    a fourth amplifier for receiving the outputs of the second and third amplifiers, the output of said fourth amplifier being connected to respective active voltage dividers at the outputs of the first and second amplifiers, such that a temperature drift error is determined by the fourth amplifier and is applied to compensate the output of the first amplifier for temperature drift of said main shunt.

15. The measuring system of claim 14, wherein said stable shunt and calibration shunt have resistances substantially greater than the main shunt.

16. The measuring system of claim 15, wherein said stable shunt and calibration shunt each have resistances that are n times greater than the resistance of the main shunt, where n is in the range of about 50 to 100.

17. The measuring system of claim 14, wherein the active voltage dividers are implemented by MOSFETs.

18. The measuring system of claim 14, wherein the stable shunt is formed from manganin, or similar temperature stable alloy.

19. The measuring system of claim 14, wherein the fourth amplifier is a differential operational amplifier.

* * * * *